(12) United States Patent
Zhang et al.

(10) Patent No.: US 6,947,205 B2
(45) Date of Patent: Sep. 20, 2005

(54) BISTABLE MOLECULAR MECHANICAL DEVICES ACTIVATED BY AN ELECTRIC FIELD FOR ELECTRONIC INK AND OTHER VISUAL DISPLAY APPLICATIONS

(75) Inventors: Xiao-An Zhang, Sunnyvale, CA (US); R. Stanley Williams, Redwood City, CA (US); Kent D. Vincent, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 363 days.

(21) Appl. No.: 09/898,799

(22) Filed: Jul. 3, 2001

(65) Prior Publication Data

US 2002/0075557 A1 Jun. 20, 2002

Related U.S. Application Data

(63) Continuation-in-part of application No. 09/844,862, filed on Apr. 27, 2001, now Pat. No. 6,763,158, which is a continuation-in-part of application No. 09/823,195, filed on Mar. 29, 2001, which is a continuation-in-part of application No. 09/759,438, filed on Jan. 12, 2001, now Pat. No. 6,512,119, which is a continuation-in-part of application No. 09/738,793, filed on Dec. 14, 2000, now Pat. No. 6,663,797.

(51) Int. Cl.[7] .............................. G02F 1/29; G02F 1/00
(52) U.S. Cl. ....................... 359/321; 359/315; 359/316; 359/318
(58) Field of Search ................................. 359/321, 315, 359/316, 318, 320, 322, 238, 242, 243, 245

(56) References Cited

U.S. PATENT DOCUMENTS

| | | | |
|---|---|---|---|
| 4,166,200 A | * | 8/1979 | Reichen et al. ........... 200/11 R |
| 4,481,588 A | * | 11/1984 | Komiya ...................... 700/192 |
| 4,827,604 A | * | 5/1989 | Hoffman ........................ 29/622 |
| 5,179,065 A | | 1/1993 | Ito |
| 5,982,346 A | | 11/1999 | Sheridon et al. .............. 345/85 |
| 6,017,584 A | | 1/2000 | Albert et al. ............. 427/213.3 |
| 6,067,185 A | | 5/2000 | Albert et al. ................ 359/296 |
| 6,128,214 A | | 10/2000 | Kuekes ........................ 365/151 |
| 6,249,369 B1 | * | 6/2001 | Theiste et al. .............. 359/265 |
| 6,549,255 B2 | * | 4/2003 | Stebler et al. .............. 349/127 |
| 6,556,470 B1 | * | 4/2003 | Vincent et al. ............. 365/151 |

FOREIGN PATENT DOCUMENTS

WO    WO0288837    11/2002

OTHER PUBLICATIONS

Suzuki et al: "A new type of tricolor electrochromic system based on the dynamic redox properties of hexaarylethane deivatives" Chemical Communications vol. 20—1998 pp. 2193–2194 XP-002244733.

(Continued)

*Primary Examiner*—Timothy Thompson

(57) ABSTRACT

An electric field activated bi-stable molecular system configured within an electric field generated by a pair of electrodes is provided for use, e.g., as electronic ink or other visual displays. The molecular system has at least one rotor portion connected to at least one stator portion, wherein the rotor portion rotates with respect to the stator portion between at least two different states upon application of the electric field, thereby inducing a band gap change in the molecular system, wherein in a first state, there is extended conjugation throughout the major portion of the molecular system, resulting in a relatively smaller band gap, and wherein in a second state, the extended conjugation is destroyed, resulting in a relatively larger band gap. A primary advantage of the molecular system is improved contrast. Because the colorant of the present invention is molecular and thus effectively monoplanar, there should be no backside reflection or scattering from the colorant. A second advantage of the present invention is improved resolution. Finally, each molecule of the present invention will latch to stabilize one or the other of its color states.

32 Claims, 5 Drawing Sheets

OTHER PUBLICATIONS

Just E M et al: "Picosecond Molecular Switch based on the Influence of Photogenerated electric fields on optical changes transfer transistions" Superlattices and Microstructures Academic Press, London, GB vol. 28 No. 4, 2000 pp. 317–328 XP-001145935.

Balzani et al: "Molecular Machines" Accounts of Chemical Research, American Chemical Society, Washington, US vol. 3, No. 7, 1998, pp. 405–414 XP00826304.

Kolodner et al: "Electric–field–induced Schiff–base deprotonation in D85N mutant bacteriorhodopsin" Proceedings of the National Academy of Science of USA. National Academy of Scince in Washington, US vol. 94, Oct. 1996 pp. 11618–11621 XP000980079.

Sinha et al: "Ground–and excited–state dipole moments of some nitroaromatics: Evidence of extensive change transfer in twisted nitrobenzene system" Journal of Chemica lPhysics, NY, US vol. 93, No. 10, Nov. 15, 1990 pp. 7085–9606 XP008006682.

C.P. Collier et al., "Electronically Configurable Molecular–Based Logic Gates", Science, vol. 285, pp. 391–394 (Jul. 16, 1999).

C.P. Collier et al., "A [2]Catenane–Based Solid State Electronically Reconfigurable Switch", Science, vol. 289, pp. 1172–1175 (Aug. 18, 2000).

\* cited by examiner

BISTABLE MOLECULAR MECHANICAL DEVICES ACTIVATED BY AN ELECTRIC FIELD FOR ELECTRONIC INK AND OTHER VISUAL DISPLAY APPLICATIONS

CROSS-REFERENCE TO RELATED APPLICATIONS

The present application is a continuation-in-part application of Ser. No. 09/844,862, filed Apr. 27, 2001 now U.S. Pat. No. 6,763,158, which in turn is a continuation-in-part application of Ser. No. 09/823,195, filed Mar. 29, 2001, which in turn is a continuation-in-part application of Ser. No. 09/759,438, filed Jan. 12, 2001, now U.S. Pat. No. 6,512,119, issued Jan. 28, 2003, which in turn is a continuation-in-part application of Ser. No. 09/738,793, filed Dec. 14, 2000 now U.S. Pat. No. 6,663,797.

The present application is directed to a specific molecular system that involves at least one rotatable segment (rotor or rotors) that has a large dipole moment and that links with at least one other portion of the molecule that is immobilized (stator or stators). The molecular system disclosed herein provides switching from one state to a different state, characterized by a change in the optical properties, including color, of the molecules. In the case of color switching, the present invention turns ink or dye molecules into active opto-electronic devices that can be switched with an external electric field for electronic ink and other visual display applications.

TECHNICAL FIELD

The present invention relates generally to visual display applications, such as electronic ink, and, more particularly, to a molecular system that provides optical switching. Optical devices of both micrometer and nanometer scale may be constructed in accordance with the teachings herein.

BACKGROUND ART

Flexible displays made with a technology known as electronic ink, or E ink, are in the process of commercial development. While the early versions are expected to resemble simple displays that might sit by the side of a highway to warn of trouble ahead or might advertise specials at a convenience store, later versions are expected to lead to electronic books with paper-like pages and illustrations that move, newspapers that update themselves, reusable paper displays for cellular phones, disposable TV screens, and even electronic wallpaper.

There are two presently-known competing technologies: E Ink's electrophoretic displays and Xerox's gyricon spheres.

The electrophoretic displays are disclosed, for example, in U.S. Pat. No. 6,017,584, issued Jan. 25, 2000, and entitled "Multi-Color Electrophorectic Displays and Materials for Making the Same", and in U.S. Pat. No. 6,067,185, issued May 23, 2000, and entitled "Process for Creating an Encapsulated Electrophoretic Display".

Generally, an encapsulated electrophoretic display includes one or more species of particles that either absorb or scatter light. One example is a system in which the capsules contain one or more species of electrophoretically mobile particles dispersed in a dyed suspending medium. Another example is a system in which the capsules contain two separate species of particles suspended in a clear suspending fluid, in which one of the species of particles absorbs light (black), while the other species of particles scatters light (white). Other extensions are possible, including more than two species of particles, with or without a dye, etc. The particles are commonly solid pigments, dyed particles, or pigment/polymer composites.

The gyricon spheres are disclosed in a number of patents issued and assigned on their face to Xerox Corporation; an example of one such patent is U.S. Pat. No. 5,982,346, issued Nov. 9, 1999, and entitled "Fabrication of a Twisting Ball Display Having Two or More Different Kinds of Balls".

The gyricon, also called the twisting-ball displayed, rotary ball display, particle display, dipolar particle light valve, ect., a technology for making a form of electric paper. Briefly, a gyricon is an addressable display made up of a multiplicity of optically anisotropic balls, each of which can be selectively rotated to present a desired face to an observer. Thus, in one version at least, the gyricon is a solid microsphere, hemispherically-colored black and white and having hemispherically-opposing zeta potentials. Each gyricon rotates within a dielectric oil-filled microcavity formed in the media upon exposure to an externally-applied electric field.

The primary disadvantage of both electrophoretic ink and the gyricon is poor contrast. Hemispherically-colored microspheres, or microcapsules, being fully three dimensional, have backside reflection and scattering that reduce the contrast of dark and white images reflected toward the observer. Additionally, both colorants are at least partially visible in microcapules containing both particulate and liquid colorant, independent of which colorant is electrophoretically moved toward the observer. This, too, negatively impacts image contrast.

The second disadvantage of both the electrophoretic ink and the gyricon solutions is limited image resolution. Both solutions are limited to practical microcapsule or microsphere diameters on the order of 20 to 40 micrometers. Electrophoretic ink microcapsules are limited by the need to microencapsulate sufficient pigmented colorant to provide reasonable color contrast and opacity within each microcapsule. Gyricon spheres are limited by thermal mass requirements to form microspheres from coalesced colored droplets in water. Microsphere diameters on the order of 5 to 10 micrometers are desired and common to toner colorant used in laser printers.

Each prior solution must use a low dielectric liquid (oil), rather than water. Water, being conductive, would collapse the electric field that otherwise allows electrophoretic movement of the colorants. The colorant switching time and voltage is dependent on oil viscosity, which is negatively impacted by lowered ambient temperature.

Finally, the prior art colorants have poor mechanical durability by virtue of their microcapsule composition. Microcapsule fabrication processes generally produce micron thin capsule walls, typically 10% of the capsule diameter, that are easily broken. This factor is why microcapsules are typically used to deliver encapulsated fluids upon application of external pressure or salvation (e.g., carbonless paper) The fragile nature of microcapsules makes them poorly suited for electronic paper applications where folding and surface contact is common.

Thus, what is needed is a molecular system that exhibits image contrast and mechanical durability commensurate with ink on paper, avoids chemical oxidation and/or reduction, permits reasonably rapid switching from a first state to a second, is reversible to permit real-time or video rate display applications, and can be used in a variety of optical display applications, such as e-ink.

DISCLOSURE OF INVENTION

In accordance with the present invention, a switchable medium for a visual display comprising an electric field activated bi-stable molecular system configured within an electric field generated by a pair of electrodes is provided. The molecular system has at least one rotor portion connected to at least one stator portions, wherein the rotor portion(s) rotates with respect to the stator portion(s) between at least two different states upon application of the electric field, thereby inducing a band gap change in the molecular system, wherein in a first state, there is substantial conjugation throughout the molecular system, resulting in a relatively smaller band gap, and wherein in a second state, the substantial conjugation is changed, resulting in a relatively larger band gap.

The present invention provides field switchable molecules that can be assembled easily to make electronic ink, visual displays, electronic books, rewritable media, and the like, in which the molecules reversibly change color when changing state (e.g., one color to a second color or transparent to color). Such applications are discussed elsewhere, and are not germane to the present invention, except to the extent that the field switchable molecules of the present invention are employed in the construction of apparatus of such applications.

Thus, the molecule is neither oxidized nor reduced in the toggling of the switch. Further, the molecule exhibits image contrast and mechanical durability commensurate with ink on paper. Also, the part of the molecule that moves is quite small and free of viscous drag forces, so the switching time should be very fast.

A primary advantage of the molecular system of the present invention is improved contrast. Because the colorant of the present invention is molecular and thus effectively monoplanar, there should be no backside reflection or scattering from the colorant. The background color (e.g., white) of the electronic media is provided by the media substrate or substrate coating and is not compromised by the switchable colorant.

A second advantage of the present invention is improved resolution. In this instance, resolution is only limited by the addressing scheme, since the colorant has molecular dimensions.

Finally, each molecule of the present invention will latch to stabilize one or the other of its color states.

BRIEF DESCRIPTION OF THE DRAWINGS

FIG. 3 is a schematic representation of a first method and apparatus for writing and erasing in accordance with the present invention as shown in FIGS. 1 and 1a;

FIG. 4 is a schematic representation of a second method and apparatus for writing and erasing in accordance with the present invention as shown in FIGS. 1 and 1a;

BEST MODES FOR CARRYING OUT THE INVENTION

Definitions

Figures 1, 1A:
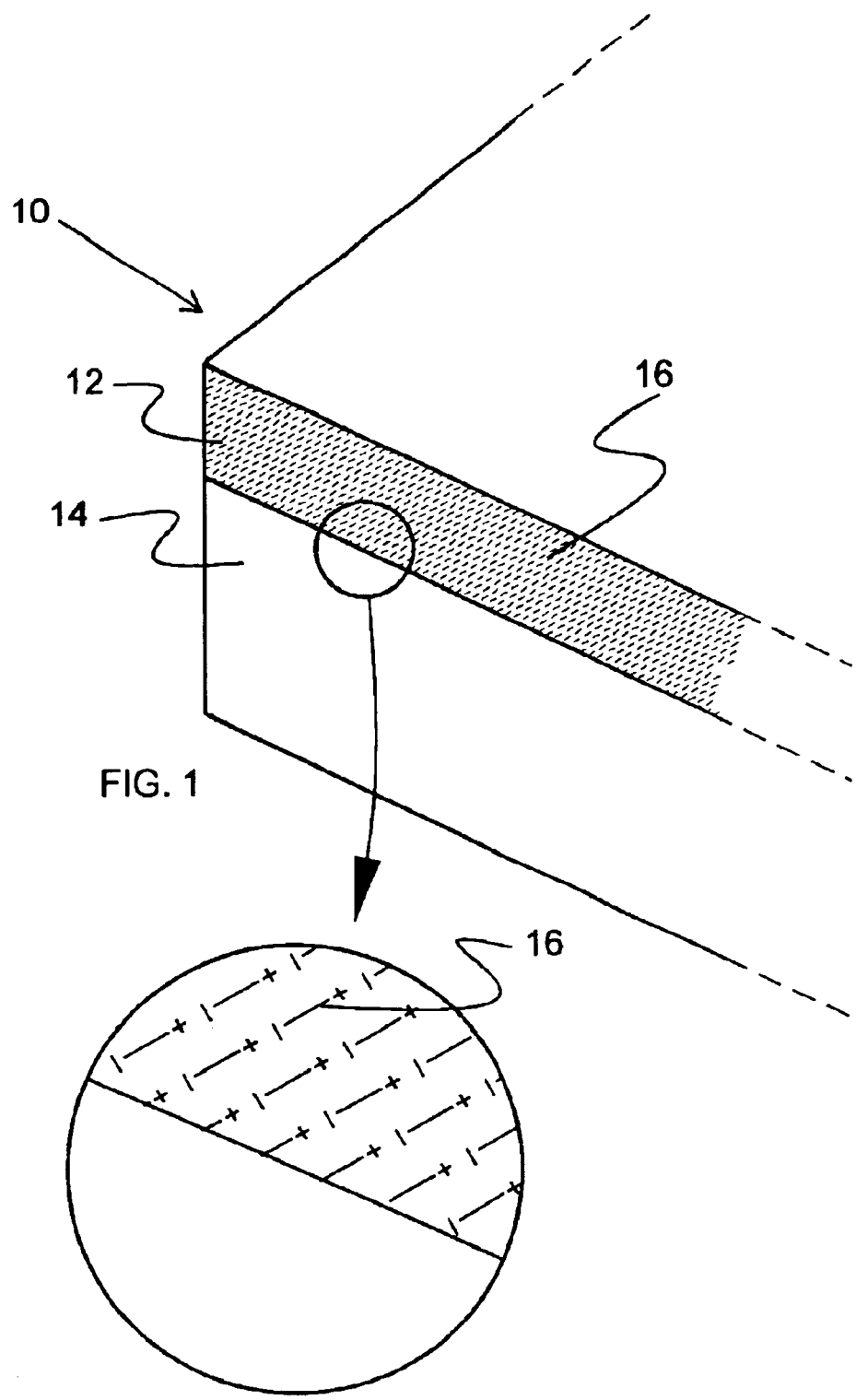
FIG. 1 is a schematic representation (perspective, transparent view) of a two color (e.g., black and white) display screen construction for use in accordance with the present invention.
FIG. 1a is an enlargement of a portion of FIG. 1, showing the detail for a colorant layer element of the display screen.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM) or a color pixel in a display.

The term "bi-stable" as applied to a molecule means a molecule having two relatively low energy states separated by an energy (or activation) barrier. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.05 to 10 micrometers, heights that can range from a few tens of nanometers to a micrometer, and lengths of several micrometers and longer.

"HOMO" is the common chemical acronym for "highest occupied molecular orbital", while "LUMO" is the common chemical acronym for "lowest unoccupied molecular orbital". HOMOs and LUMOs are responsible for electronic conduction in molecules and the energy difference between the HOMO and LUMO and other energetically nearby molecular orbitals is responsible for the color of the molecule.

An electronic ink, in the context of the present invention, involves switchable changes in the electromagnetic properties of the molecules, within that spectral region detectable by the human eye. Switching of electronic ink molecules includes changes in properties such as absorption, reflection, refraction, diffraction, and diffuse scattering of electromagnetic radiation.

Electronic Ink

Field addressable rewritable media are described in greater detail in copending U.S. application Ser. No. 09/919,394, filed on Jul. 31, 2001 [PD-10011314-1]. A generic example taken from that application is depicted herein in FIG. 1. As illustrated schematically in a magnified partial view in FIG. 1, electronic print media 10 comprises an electrochromic coating 12 affixed superadjacently to a backing substrate 14. The electrochromic coating 12 is a molecular colorant coating that contains molecules 16 (represented by greatly magnified lines) that undergo chemical changes as a result of application of an electric field that, in effect, changes selectively localized regions of this coating from one hue to another. In order to describe the print media 10, the electrochromic molecules themselves are depicted as polarized lines 16 in FIG. 1a; however, it should be recognized that there are literally "millions" of such molecules per cubic micrometer of colorant.

It will be immediately apparent that the electrochromic molecular colorants of the present invention are substantially and uniquely different than the microcapsule technology currently employed in electronic inks. Since the molecules of the present invention themselves are changing color in response to an applied electric field, the issues of contrast and image resolution are resolved. In the former case, backside reflection and scattering of light is eliminated, since molecules, not microspheres, are the agents of color change. In the latter case, again, molecules, being much smaller than microspheres, result in greatly improved image resolution, switching speed, out-of-band transparency, and durability.

Figure 2A:
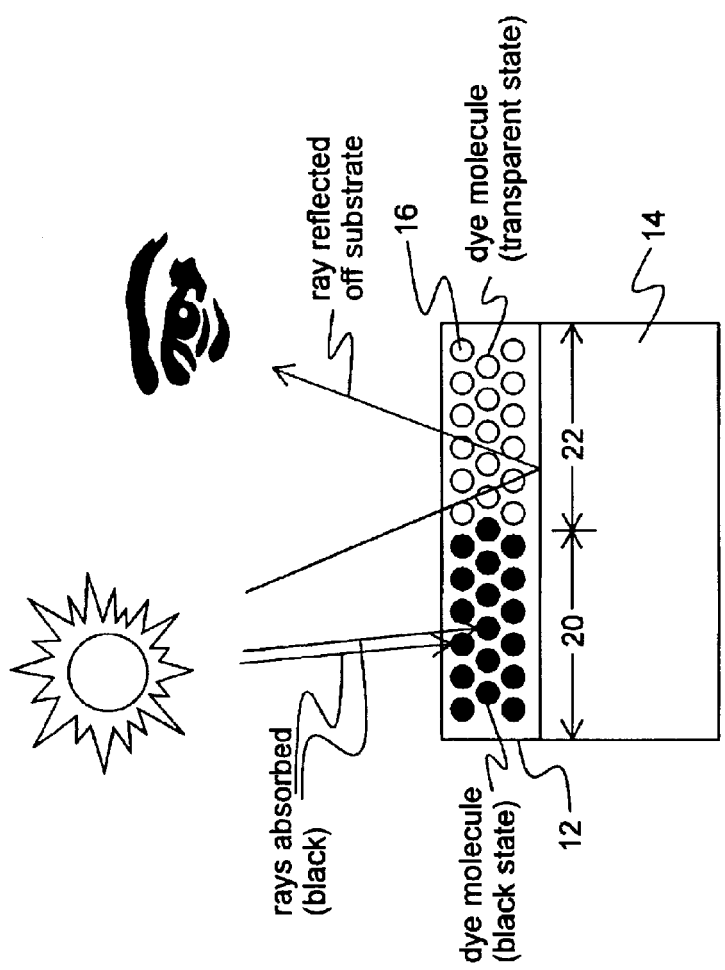
FIG. 2a is a schematic representation (perspective, transparent view) of a full-color display screen construction for use in accordance with the present invention.
Figure 2B:
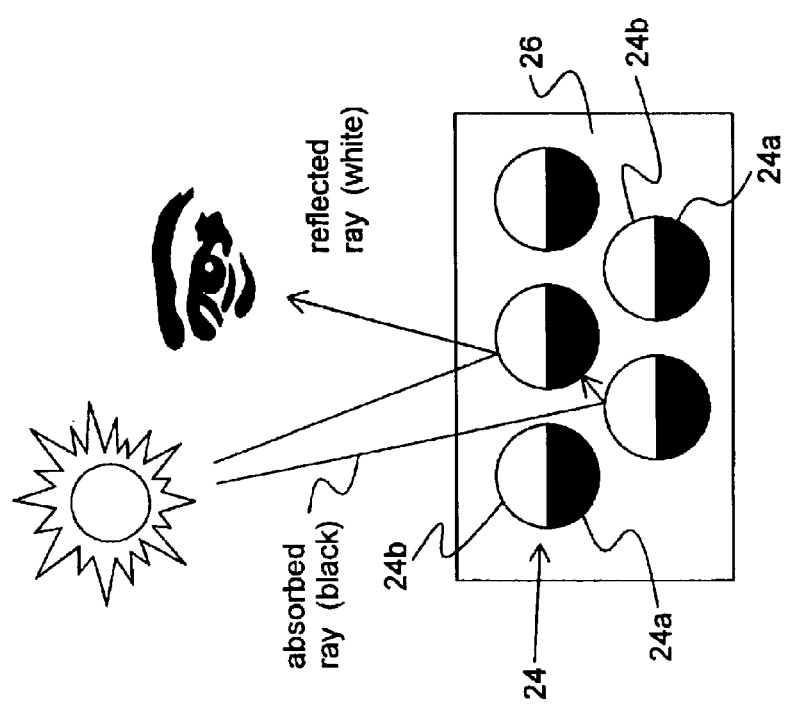
FIG. 2b is a view similar to that of FIG. 2a, but depicting a prior art approach.

With respect to the molecular technology described in greater detail below, the overwhelming advantage of electrochromic molecular colorants over microcapsule technology (see, Background of the Invention, supra) for electronic print media is the realization of standardized print contrast and image resolution. Such use of electrochromic molecular colorants will provide readable content that resembles conventional printing dyes or pigments on paper forms in color mode, color density, and coating layer incorporability. As depicted in FIG. 2a, illustrating a stark contrast to the combined absorption-reflection physics of hemispheric microcapsule technology as depicted in FIG. 2b, in the high color density state 20 (e.g., black), the electrochromic molecular colorant coating 12, comprising dye molecules 16, absorbs light uniformly at all light incidence angles to provide conventional ink color density. In the transparent state 22 (FIG. 2a, right side), the bichromal molecules 16 of the present invention do not absorb any visible light appreciably, allowing media substrate 14 to fully show through the coating layer 12. The difference between the two groups of molecules is simply the energetic state in which they reside, as discussed more fully below. Thus, to the observer, an electrochromic molecular colorant image appears substantially identical to the image as it would appear in conventional ink print on paper. Namely, gradations of the specific high density color, if any, are invisible to the naked eye. The term "electrochromic molecular colorant" as used herein is expressly intended to include a plurality of different colorant molecules blended to form a layer that can achieve a desired composite color other than the exemplary black state.

Referring to FIG. 2b, which depicts the prior art approach, it is seen that microspheres 24, provided with a black hemisphere 24a and a white hemisphere 24b, are immersed in a liquid 26. Overlapping spheres in multiple layers are needed to achieve adequate color density, limiting pixel resolution to the order of 300 to 400 dots-per-inch ("dpi") (whereas the unaided vision, human eye can discriminate to about 1,000 dpi or better resolution). Displays made from such microcapsules tend to have poor contrast and color because light that penetrates beyond the surface layer reflects off of the backside of subadjacent microcapsules, causing color mixing. As seen in FIG. 2b, poor image contrast arises from backside reflections from each microcapsule. Light entering and penetrating the interstices of a first layer of microcapsules 24 in the media surface coating 26 reflects and is absorbed by the backside 24b, as well as the front side 24a, hemispheres of subsequent microcapsule layers. Low color density areas of the image become darker and high color density areas become lighter than would otherwise occur if the microcapsules were of uniform color throughout their exterior (as is true with pigments and dyes used in conventional printing processes). Thus, in a device using layers of bichromal microcapsules, the image is often actually rendered dark gray against a light gray background.

It will be noted that the electrochromic molecular colorant depicted in FIG. 2a is spatially addressable at its molecular (Angstrom) scale, allowing far greater image resolution than the tens-of-micrometers scale of microcapsule colorants. A molecular wire adaptable for such use is described in U.S. Pat. No. 6,128,214, entitled "Molecular Wire Crossbar Memory" by Philip J. Kuekes et al, issued on Oct. 3, 2000, and assigned to the present assignee, incorporated herein by reference.

Further, the color switching time for the electrochromic molecular colorant pervaded pixel regions of the media 10 is significantly shorter than that for microcapsule colorants, allowing significantly faster imaging speeds, in the main because the electrochromic molecules of the colorant are substantially stationary and change color either through the movement of electrons, the twisting of molecular elements, or both. In each case, the total mass in movement for any addressed pixel is many orders of magnitude smaller than that required with microcapsule colorants.

Still further, electronic media 10 containing the electrochromic molecular colorant coating layer(s) as described in detail hereinafter have the durability of print on conventional media and are not subject to colorant breakage through externally applied pressure in manufacture or use as is media coated with microcapsule colorants.

In one embodiment, depicted in FIGS. 1 and 1a, the electronic media 10 is electric field addressable and is rewritable. The media 10 comprises (a) a bichromal molecular electrochromic molecular colorant impregnated coating liquid vehicle (hereinafter generically referred to as the coating 12 which forms the writable-erasable layer of media 10) and (b) a substrate 14 upon which the coating is affixed.

The substrate 14 may comprise a variety of materials and forms. As one example of typical hard copy application uses, the coating 12 may be affixed onto a flexible plastic material substrate 14 in the approximate size, thickness, and shape of common stationary letterhead. The particular substrate 14 composition implemented is fully dependent on the specific application and, particularly, to the role that the substrate plays in supporting or creating the electric field that is imposed across the coating layer 12.

The coating layer 12 of the media 10 comprises bichromal molecules 16 (FIGS. 1, 1a), or molecules in association with another chemical component, the "vehicle", having an electrical field responsive high color density state (hereinafter simply "color state") and a transparent state. The vehicle may include binders, solvents, flow additives, or other common coating additives appropriate for a given implementation.

Preferably, the colorant of the coating 12 obtains a color state (e.g., black) when subjected to a first electrical field and a transparent state when subjected to a second electrical field. The coating 12, or more specifically, the addressable pixel regions of the media 10, in a preferred embodiment is thus referred to as "bi-stable"; in other words, once set or written, the field targeted, "colored pixel", molecules (the "printed content") remain in the current state until the second field is applied, "erasing" the image by returning the molecules to their transparent state at the field targeted pixels. No holding electrical field is required to maintain the printed content.

Alternatively, the colorant may be monostable, obtaining a localized, first color state (e.g., transparent) which subjected to a localized electrical field, then configuratively relaxing to a second color state (e.g., black) in the absence of the field.

Preferably, the chromatic reaction of each of the aforementioned colorant types is field reversible and bi-stable in the absence of a field so that a field is not required to hold the image and the image may be written, erased, and overwritten many times.

Although very different in constitution, the coating composition employed herein is analogous to conventional coating formulation technology. The constituents will depend on the rheology and adhesion needs of the printing/coating process and substrate material. Typically, the coating layer 12 will comprise 1 to 30 wt % of the solid content of the film deposited to form the coating layer on the substrate 14. This amount is usually determined by desired image color density. The coating 12 will also typically include a polymeric binder to produce a dried or cured coating layer on the substrate 14 in which the electrochromic molecular colorant is suspended. Alternatively, the solids content may include as much as 100% colorant for certain known manner evaporative deposition methods wherein the colorant, or an associated vehicle, is evaporated. In the case of colorant evaporation, there may be no associated vehicle.

In some instances, the colorant must be pre-oriented within the deposited coating layer 12 to allow the optimum alignment with the electrical field that will be used to write and erase a printed content. Such orientation may be achieved by solidifying the deposited coating layer 12 under the influence of a simultaneously applied electric field across the media 10.

In one specific embodiment, the coating 12 comprises electrochromic molecular colorant and a liquidous, ultraviolet (UV) curable, prepolymer (e.g., (meth)acrylate or vinyl monomers/oligomers). The polymer in this instance is formed in situ on the media substrate 10 when subjected to UV radiation. Such prepolymers are well-known in the coatings art.

In a second specific embodiment, coating solidification may occur through thermally activated vehicle chemical reactions common to epoxy, urethane, and thermal free radical activated polymerization.

In a third specific embodiment, coating solidification may occur through partial or total vehicle evaporation.

The colorant may also self-orient through colorant/coating design that allows a self-assembled lattice structure, wherein each colorant monomer aligns with adjacent colorant monomers. Such design and lattice structures, for example, are common to dendrimers and crystals. Processes for self-assembly may include sequential monolayer deposition methods, such as well-known Langmuir film and gas phase deposition techniques.

The substrate 14 should be fabricated of a material having a dielectric constant and electrical conductivity which complements that of the colorant coating layer 12.

Figure 3:
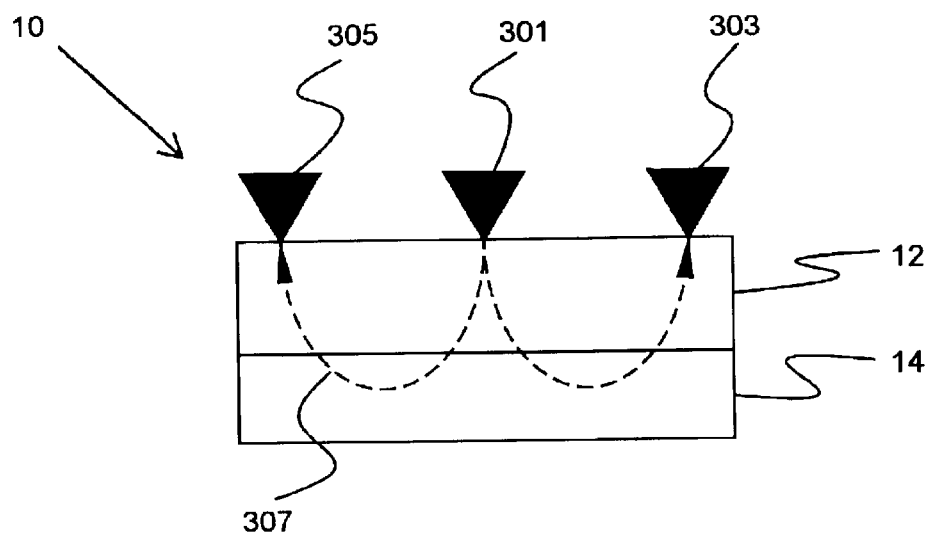

Turning now to FIG. 3, for the implementation such as a simple sheet of rewritable hard copy media or a data storage media 10, it may be desirable to create an electrical writing field from a single coating side, for example, with an electronic pen tip or electrode pair 301 and 303 or 301 and 305, and to entrain the field across the coating layer 12. In such instances, an appropriately low conductivity and dielectric constant colorant coating 12 is desirable to prevent field shunting within the coating layer. The electrical properties of the substrate 14 are less important with such fringe fields (represented by dashed arrow 307) type writing instruments.

Figure 4:
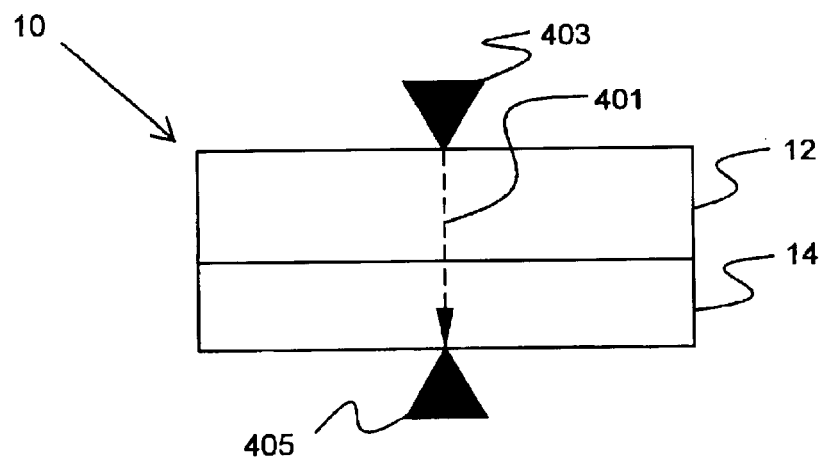

For applications in which it is desirable to create the writing field (dashed arrow 401) through the media 10 thickness, such as depicted in FIG. 4, with electrodes 403, 405 on opposing sides of the media, the substrate 14 preferably has a high dielectric constant, or high electrical conductivity if the adjacent electrode is common to all pixels. These properties minimize the voltage drop (loss) across the substrate 14 to minimize media switching voltage requirements. For example, employable substrates 14 are selected from the group consisting of titania-filled plastics, certain high dielectric constant resin-impregnated papers, and metals.

For certain implementations, e.g., large display boards, it is desirable to coat substrates having an electrode or array of electrodes included on the substrate surface to be coated. Representative substrates include metal-clad fiberboards, printed circuit boards, metallized glass, surface-etched metallized glass, graphite impregnated rubbers and plastics, sheet metals, and the like.

Figure 5:
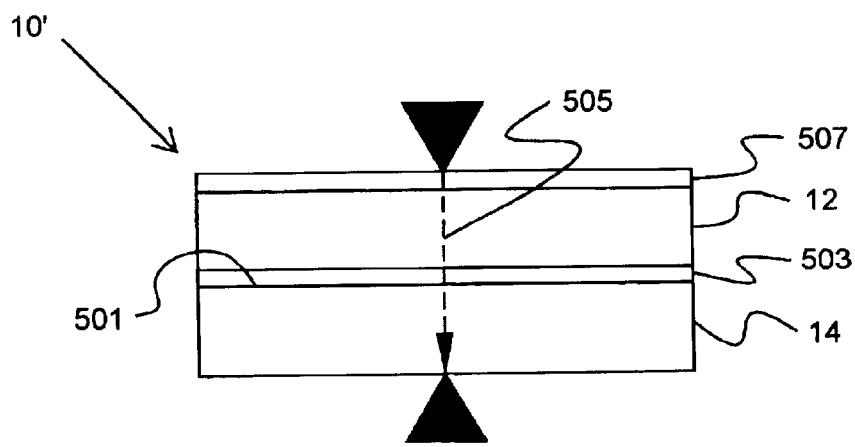
FIG. 5 depicts an alternate embodiment of the present invention as illustrated by FIGS. 1, 3, and 4.
Figure 6:
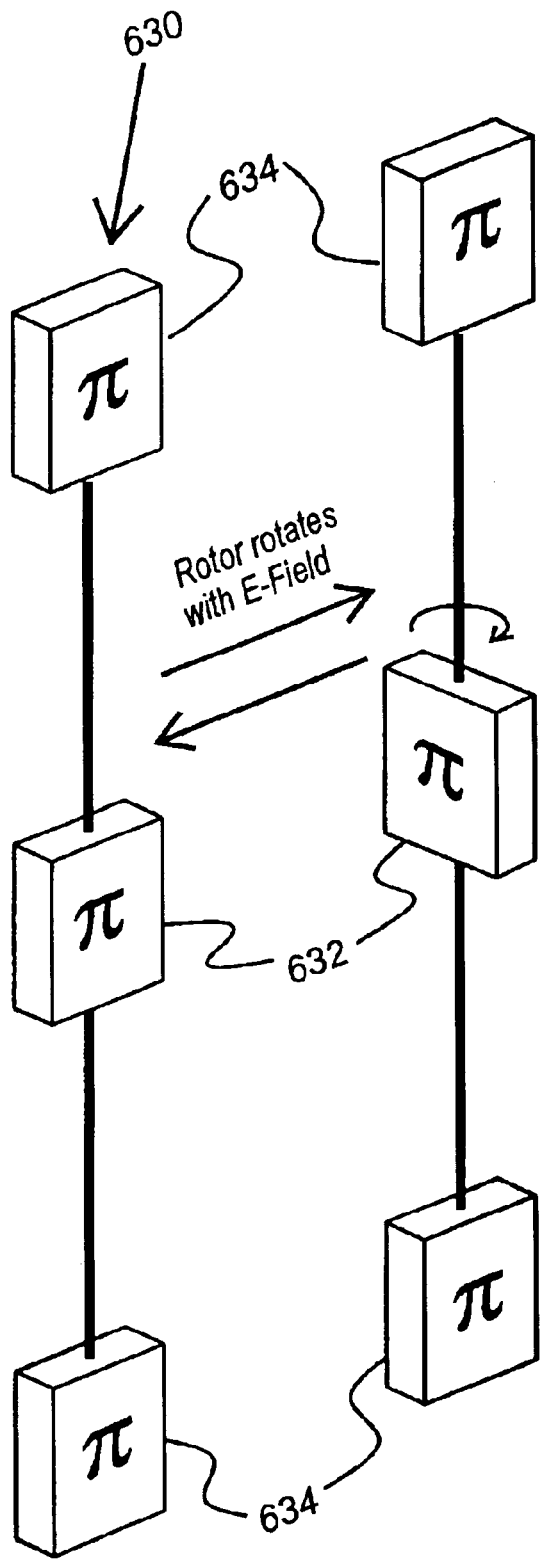
FIG. 6 is a schematic model depicting an E-field-induced band gap change via rotation of one portion (rotor) relative to two other portions (stators)

Turning now to FIG. 5, in a more costly embodiment, the media 10' may include a substrate 14 having a reflective substrate 501 coated with a preferred background color layer 503, wherein the background color remains fixed and independent of the imposed electric writing fields (dashed arrow 505). This surface 501 will normally create the background color of the media 10' when the molecular colorant coating layer 12 is switched to the transparent state. Such surface coatings generally comprise a conventional pigment or colorant incorporated in a polymer binder. As with the substrate 14, the coating layer 503 comprises a binder and colorant of a composition chosen to maintain the integrity of the electric field 505 imposed on the media 10' and to minimize additional voltage drop across the media. Alternatively, a conventional pigment or colorant may be incorporated into the substrate 14 itself. Such surface coating and incorporated substrate coloration fabrication processes are well-known in the media art.

The media 10' may further include a protective surface layer 507. In general, the protective surface layer 507 is visibly transparent and protects the colorant coating 12 from abrasion, photo-oxidative color fade, chemical decomposition, or other environmentally-imposed factors that may alter the integrity of the media 10'. Fabrication of the protective surface layer 507 can be performed in a known manner, such as a polymeric coating, a transparent material deposition, or a laminate. As examples, polymethyl methacrylate and polyurethane type polymeric coatings are known to contain ultraviolet radiation absorbing additives; thin film, vapor deposited, glass and polymer laminate films may also be employed. Methods of layer application are also well-known in the art. As with the substrate 14, the protective surface layer is preferably composed to maintain the integrity of the electric field imposed on the media 10' and to minimize additional voltage drop across the media.

Present Invention

In accordance with the present invention, a molecule system is provided that comprises at least one rotatable segment (rotor or rotors) that has a large dipole moment and that links at least one other portions of the molecule that are immobilized (stator or stators). Thus, the present invention turns ink or dye molecules into active devices that can be switched with an external electric field by a mechanism completely different from any previously described electrochromic or chromogenic material.

Under the influence of an applied electric field, the vector dipole moment of the rotor will attempt to align parallel to the direction of the external field. However, the molecule is designed to have inter- and/or intra-molecular forces, such as hydrogen bonding or dipole-dipole interactions as well as steric repulsions, that stabilize the rotor in particular orientations with respect to the stator(s). Thus, a large field is required to cause the rotor(s) to unlatch from an initial orientation and rotate with respect to the stator(s), if the direction of the applied field is opposite to that of the dipole of the rotor. Once switched into a particular orientation, the molecule will remain in that orientation until it is switched out. For most electronic ink applications, the voltage will be greater than 1 volt, perhaps 1 to 50 volts.

There are a number of combinations that can be envisioned; examples include, but are not limited to, (1) one rotor connected to one stator, (2) one rotor connected between two stators (one preferred combination), (3) two or more rotors each connected to one stator, and (4) alternating rotors and stators. Depending on the specific configuration, the stator(s) may be connected to another stator on another molecule or to a substrate in order to immobilize the stator(s) with respect to the rotor(s). In employing the terms "rotor" and "stator", it will be appreciated that what is meant is one part of the molecule rotating with respect to another part of the molecule; thus, the motion of one segment in the molecule with respect to another is relative.

One embodiment of the molecule design is that there is a steric or Coulomb repulsion that will prevent the rotor from rotating through a complete 180 degree half cycle. Instead, the rotation is halted by the steric interaction of bulky groups on the (1) rotor(s), or (2) stator(s) or (3) both the rotor(s) and stator(s) at an angle of approximately 10 to 170 degrees from the initial orientation. Furthermore, this 10 to 170 degree orientation is stabilized by a different set of inter- and/or intra-molecular hydrogen bonds or dipole interactions, and is thus latched into place even after the applied field is turned off. For colored ink and dye molecules, this ability to switch the rotor between two states separated by approximately 10 to 170 degrees from the stators is crucial.

In the ideal case, for the orientation where the rotor(s) and stator(s) are all co-planar, the molecule is in its fully conjugated state. Thus, the π or π-and non-nonebonding-electrons of the molecule are delocalized over a large portion of the molecule. The effect is identical to that for a quantum mechanical particle in a box—when the box is the size of the entire molecule, i.e., when the orbitals are delocalized, the gap between the HOMO and LUMO is relatively small. In this case, the HOMO-LUMO gap of the molecule is designed to yield the desired color of the ink or dye. The HOMO-LUMO gap for the all-parallel structure can be tuned by substituting various chemical groups onto the stators and/or rotor(s). In the case where one or more rotor is rotated by 10 to 170 degrees with respect to one or more stator (nominally, 90 degrees), the conjugation of the molecule is broken and the HOMO and LUMO are no longer delocalized over the large portion of the molecule. This has the effect of shrinking the size of the box, which causes the HOMO-LUMO gap to increase. Depending on the nature of the chemical substituents bonded to the rotor(s) and stator(s), this increased HOMO-LUMO gap will correspond to a color that is blue-shifted with respect to the color of the all-parallel structure or is even totally transparent, if the new HOMO-LUMO gap is large enough. Thus, the molecule is switchable between two colors or from one color to a transparent state.

The molecules of the present invention evidence an electric field ("E-field") induced rotation of at least one rotatable section (rotor) of a molecule to change the band gap of the molecule. Thus, the color switching is the result of an E-field induced intramolecular change rather than a diffusion or oxidation/reduction reaction, in contrast to prior art approaches. Also, the part of the molecule that moves is quite small, so the switching time is expected to be quite fast.

The following requirements must be met:
(a) The molecule must have one or more rotor segments and one or more stator segments;
(b) In one state of the molecule, there should be delocalized π-states that extend over a large portion of the molecule (rotor(s) and stator(s)), whereas in the other state, the π-states are localized on the rotor(s) and stator(s);
(c) The connecting unit between rotor(s) and stator(s) can be a single σ-bond or at least one atom with (1) non-bonding electron(s), or (2) π-electrons, or (3) π-electrons and non-bonding electron(s);
(d) The non-bonding electrons, or π-electrons, or π-electrons and non-bonding electron(s) of the rotor(s) and stator(s) can be localized or de-localized depending on the conformation of the molecule, while the rotor(s) rotate(s) when activated by an E-field;
(e) The conformation(s) of the molecule can be E-field dependent or bi-stable;
(f) The bi-stable state(s) can be achieved by intra- or inter-molecular forces such as hydrogen bonding, Coulomb force, van der Waals force, metal ion complex or dipole inter-stabilization; and
(g) The band gap of the molecule will change depending on the degree of non-bonding electron, or π-electron, or π-electron and non-bonding electron de-localization of the molecule. This will control the optical properties (e.g., color and/or index of refraction, etc.) of the molecule.

The novel bi-modal molecules of the present invention are active optical devices that can be switched with an external electric field. With reference to FIGS. 6 and 7a–7c, which depict a schematic stator-rotor-stator configuration (FIG. 6) and one preferred embodiment (FIGS. 7a–7c), the general idea is to design into the molecules a rotatable segment (rotor) 632 that has a large dipole moment (see Examples 1 and 2) and that links one or preferably two other portions of the molecule 630 that are immobilized (stators) 634. Under the influence of an applied electric field, the vector dipole moment of the rotor 632 will attempt to align parallel to the direction of the external field. However, the molecule 630 is designed such that there are inter- and/or intra-molecular forces, such as hydrogen bonding or dipole-dipole interactions as well as steric repulsions, that stabilize the rotor 632 in particular orientations with respect to the stators 634. Thus, a large electric field is required to cause the rotor 632 to unlatch from its initial orientation and rotate with respect to the stators 634.

Once switched into a particular orientation, the molecule 630 will remain in that orientation until it is switched out. However, in one embodiment of the molecule design, there is a steric or Coulombic repulsion that will prevent the rotor 632 from rotating through a complete 180° half cycle. Instead, the rotation is halted by the steric interaction of bulky groups on the rotor 632 and stators 634 at an optically significant angle of typically between 10° and 170° from the initial orientation. For the purposes of illustration, this angle is shown as 90° in the present application. Furthermore, this switching orientation may be stabilized by a different set of inter- and/or intra-molecular hydrogen bonds or dipole interactions, and is thus latched in place even after the applied field is turned off. For switch molecules, this ability to latch the rotor 632 between two states separated by an optically significant rotation from the stators is crucial.

The foregoing strategy may be generalized to design colorant molecules to provide several switching steps so as to allow multiple states (more than two) to produce a multi-state (e.g., multi-color) system. Such a system permits the optical properties of the colorant layer to be tuned continuously with a decreasing or increasing electric field or changed abruptly from one state to another by applying a pulsed field.

Further, the colorant molecules may be designed to include the case of no, or low, activation barrier for fast but volatile switching. In this latter situation, bi-stability is not required, and the molecule is switched into one state by the electric field and relaxes back into its original state upon removal of the field ("bi-modal"). In effect, these forms of the bi-modal colorant molecules are "self-erasing". In contrast, with bi-stable colorant molecules, the colorant molecule remains latched in its state upon removal of the field (non-volatile switch), and the presence of the activation barrier in that case requires application of an opposite field to switch the molecule back to its previous state.

When the rotor(s) 632 and stator(s) 634 are all co-planar, the molecule is referred to as "more-conjugated". Thus, the non-bonding electrons, or π-electrons, or π-electrons and non-bonding electrons of the molecule, are delocalized over a large portion of the molecule 630. This is referred to as a "red-shifted state" for the molecule, or "optical state I". In the case where the rotor(s) 632 is(are) rotated out of conjugation with respect to the stator(s) 634, the conjugation of the molecule 630 is broken and the HOMO and LUMO are localized over smaller portions of the molecule, referred to as "less-conjugated". This is a "blue-shifted state" of the molecule 630, or "optical state II". Thus, the colorant molecule 630 is reversibly switchable between two different optical states. It will be appreciated that while 90° rotation of the rotor is depicted in FIG. 7c, for example, the rotation in fact may be any angle that changes conjugation, as discussed above.

It will be appreciated by those skilled in the art that in the ideal case, when the rotor(s) 632 and stator(s) 634 are completely coplanar, then the molecule is fully conjugated, and when the rotor(s) 632 is(are) rotated at an angle of, say, 90° with respect to the stator(s) 634, then the molecule is non-conjugated. However, due to thermal fluctuations, these ideal states are not fully realized, and the molecule is thus referred to as being "more-conjugated" in the former case and "less-conjugated" in the latter case. Further, the terms "red-shifted" and "blue-shifted" are not meant to convey any relationship to hue, but rather the direction in the electromagnetic energy spectrum of the energy shift of the gap between the HOMO and LUMO states.

Examples 1 and 2 below show two different orientations for switching the molecules. In Example 1, the rotation axis of the rotor is designed to be nearly perpendicular to the orientation axis of the molecules, whereas in Example 2, the rotation axis is parallel to the orientation axis of the molecule. These designs allow different geometries of molecular films and electrodes to be used, depending on the desired results.

Turning first to Example 1a, this depicts a first generic molecular example for the present invention. Example 1b, which follows, depicts a specific molecular system.

Example 1a

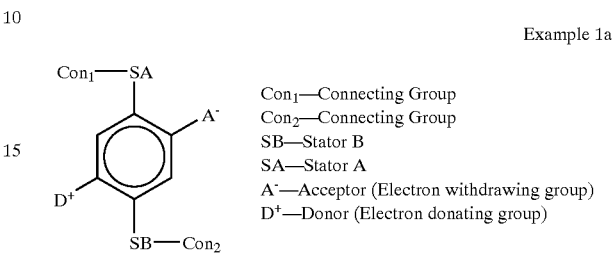

Con₁—Connecting Group
Con₂—Connecting Group
SB—Stator B
SA—Stator A
A⁻—Acceptor (Electron withdrawing group)
D⁺—Donor (Electron donating group)

where:

The letter A⁻ represents an Acceptor group; it is an electron-withdrawing group. It may be one of the following: hydrogen, carboxylic acid or its derivatives, sulfuric acid or its derivatives, phosphoric acid or its derivatives, nitro, nitrile, hetero atoms (e.g., N, O, S, P, F, Cl, Br), or functional groups with at least one of above-mentioned hetero atoms (e.g., OH, SH, NH, etc.), hydrocarbons (either saturated or unsaturated) or substituted hydrocarbons.

The letter D⁺ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

The letters Con₁ and Con₂ represent optional connecting units between one molecule and another molecule or between one molecule and a substrate. They may be any one of the following: hydrogen (utilizing a hydrogen bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

The letters SA and SB are used here to designate Stator A and Stator B. They may be a hydrocarbon (either unsaturated or saturated) or substituted hydrocarbon. Typically, these hydrocarbon units contain conjugated rings that contribute to the extended conjugation of the molecule when it is in a planar state (red shifted state). In those stator units, they may contain the bridging group $G_n$ and/or the spacing group $R_n$. The bridging group (e.g., acetylene, ethylene, amide, imide, imine, azo, etc.) is typically used to connect the stator to the rotor or to connect two or more conjugated rings to achieve a desired chromophore. The connector may alternately comprise a single atom bridge, such as an ether bridge with an oxygen atom, or a direct sigma bond between the rotor and stator. The spacing groups (e.g., phenyl, isopropyl or tert-butyl, etc.) are used to provide an appropriate 3-dimensional scaffolding to allow the molecules to pack together while providing space for each rotor to rotate over the desired range of motion.

Example 1b below is a real molecular example of one embodiment of the present invention. In Example 1b, the rotation axis of the rotor is designed to be nearly perpendicular to the net current-carrying axis of the molecules, whereas in Example 2b, the rotation axis is parallel to the orientation axis of the molecule. These designs allow different geometries of molecular films and electrodes to be used, depending on the desired results.

The letters $Con_1$ and $Con_2$ represent optional connecting units between one molecule and another molecule or between a molecule and the solid substrate. They may be any one of the following: hydrogen (utilizing a hydrogen bond),

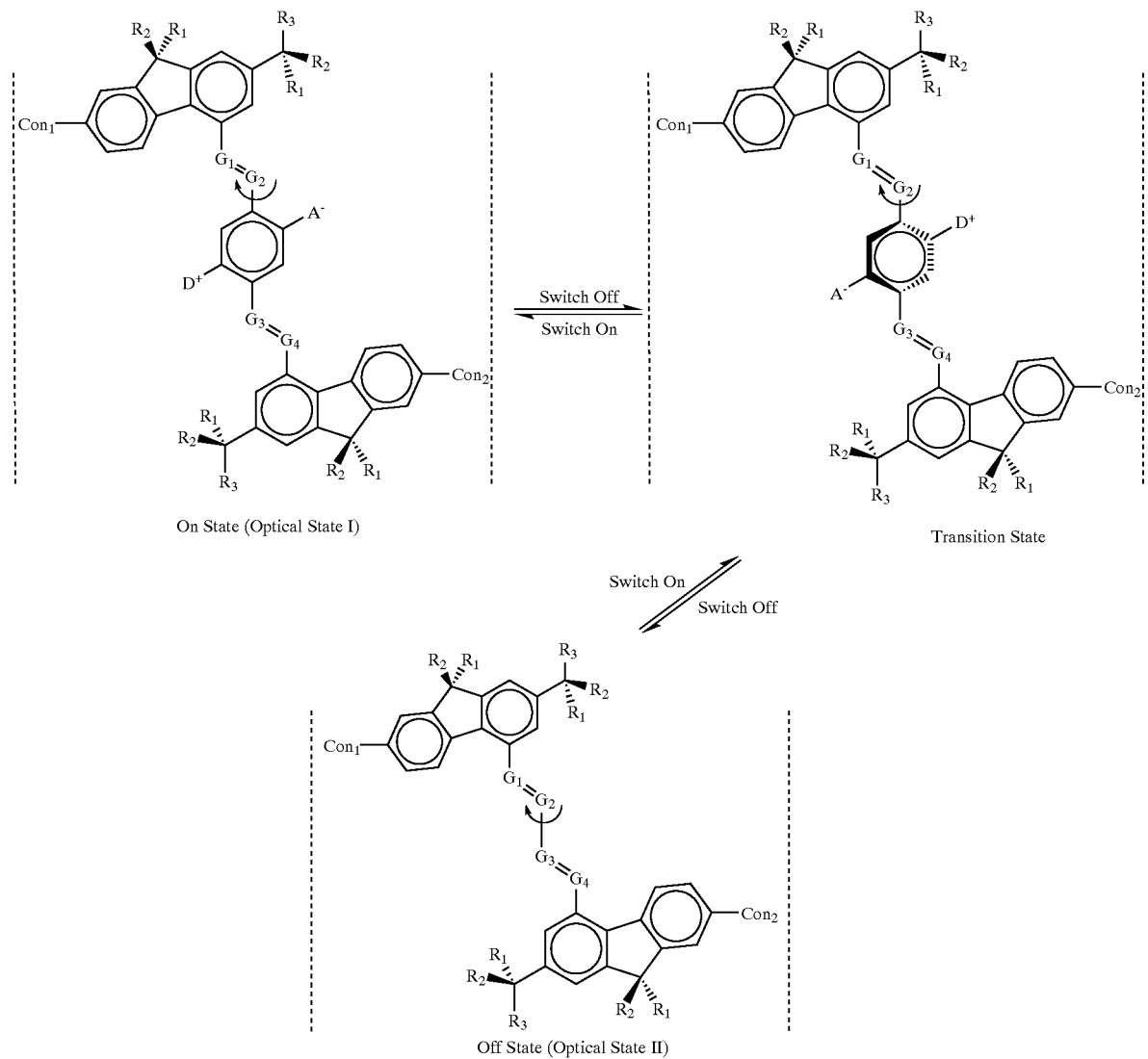

Example 1b where:

The letter $A^-$ is an Acceptor group; it is an electron-withdrawing group. It may be one of following: carboxylic acid or its derivatives, sulfuric acid or its derivatives, phosphoric acid or its derivatives, nitro, nitrile, hetero atoms (e.g., N, O, S, P, F, Cl, Br), functional group with at least one of above-mentioned hetero atoms (e.g., OH, SH, NH, etc.), hydrocarbons (either saturated or unsaturated), or substituted hydrocarbons.

The letter $D^+$ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

Letters $R_1$, $R_2$, $R_3$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbon (either saturated or unsaturated) or substituted hydrocarbon.

Letters $G_1$, $G_2$, $G_3$, and $G_4$ are bridging groups. The function of these bridging groups is to connect the stator and rotor or to connect two or more conjugated rings to achieve a desired chromophore. They may be any one of the following: hetero atoms (e.g., N, O, S, P, etc.) or functional groups with at least one of above-mentioned hetero atoms (e.g., NH or NHNH, etc.), hydrocarbons (either saturated or unsaturated) or substituted hydrocarbons. The connector may alternately comprise a single atom bridge such as an ether bridge with an oxygen atom, or a direct sigma bond between the rotor and stator.

In Example 1b above, the vertical dotted lines represent other molecules or organic or inorganic solid substrates, to which the molecule is optionally linked. The direction of the switching field is perpendicular to the vertical dotted lines. Alternatively, the linking moieties ($Con_1$ and $Con_2$) may be eliminated, and the molecule may be simply placed between the two electrodes. The molecule shown above (Example 1b) has been designed with the internal rotor 632 perpendicular to the orientation axis of the entire molecule 630. In this case, the external field is applied along the orientation axis of the molecule 630 as pictured—the electrodes (vertical dotted lines) are oriented perpendicular to the plane of the paper and perpendicular to the orientation axis of the molecule 630. Application of an electric field oriented from left to right in the diagrams will cause the rotor 632 as pictured in the upper diagram to rotate to the position shown on the lower right diagram, and vice versa. In this case, the rotor 632 as pictured in the lower right diagram is not coplanar with the rest of the molecule, so this is the blue-shifted optical state of the molecule, whereas the rotor is coplanar with the rest of the molecule on the upper diagram, so this is the red-shifted optical state of the molecule. The structure shown in the lower left diagram depicts the transition state of rotation between the upper diagram (co-planar, conjugated) and the lower right diagram (central portion rotated, non-conjugated).

With the rotor rotated out of planar conjugation, the molecule depicted in Example 1b is chromatically transparent, or blue-shifted. In the conjugated state, the molecule evidences color, or is red-shifted.

For the molecules of Example 1b, a single monolayer molecular film is grown, for example using Langmuir-Blodgett techniques or self-assembled monolayers, such that the orientation axis of the molecules is perpendicular to the plane of the electrodes used to switch the molecules. Electrodes may be deposited in the manner described by Collier et al., Science, Vol. 285, pp. 391–394 (16 Jul. 1999), and Collier et al., Science, Vol. 289, pp. 1172–1175 (18 Aug. 2000), or methods described in the above-referenced patent applications. Alternate thicker film deposition techniques include vapor phase depositions, contact or ink-jet printing, or silk screening.

Example 2a below depicts a second generic molecular example in accordance with the teachings herein. Example 2b, which follows, depicts a specific molecular system.

Example 2a

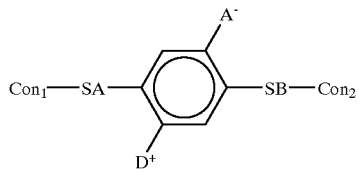

-continued $Con_1$—Connecting Group
$Con_2$—Connecting Group
SB—Stator B
SA—Stator A
$A^-$—Acceptor (Electron withdrawing group)
$D^+$—Donor (Electron donating group)

where:

The letter $A^-$ is an Acceptor group; it is an electron-withdrawing group. It may be one of following: hydrogen, carboxylic acid or its derivatives, sulfuric acid or its derivatives, phosphoric acid or its derivatives, nitro, nitrile, hetero atoms (e.g., N, O, S, P, F, Cl, Br), or functional group with at least one of above-mentioned hetero atoms (e.g., OH, SH, NH, etc.), hydrocarbon (either saturated or unsaturated) or substituted hydrocarbon.

The letter $D^+$ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

The letters $Con_1$ and $Con_2$ represent optional connecting units between one molecule and another molecule or between a molecule and a solid substrate, as in the above examples. They may be any one of the following: hydrogen (utilizing a hydrogen bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

The letters SA and SB are used here to designate Stator A and Stator B. They can be a hydrocarbon (either unsaturated or saturated) or substituted hydrocarbon. Typically, these hydrocarbon units contain conjugated rings that contribute to the extended conjugation of the molecule when it is in a planar state (red shifted state). In those stator units, they may contain bridging groups $G_n$ and/or spacing groups $R_n$. A bridging group is typically used to connect the stator and rotor or to connect two or more conjugated rings to achieve a desired chromophore The connector may alternately comprise a single atom bridge, such as an ether bridge with an oxygen atom, or a direct sigma bond between the rotor and stator. A spacing group provides an appropriate 3-dimensional scaffolding to allow the molecules to pack together while providing rotational space for each rotor.

Example 2b below is another real molecular example of a second embodiment of the present invention. As indicated above, in Example 2b, the rotation axis of the rotor is designed to be nearly parallel to the orientation axis of the molecule.

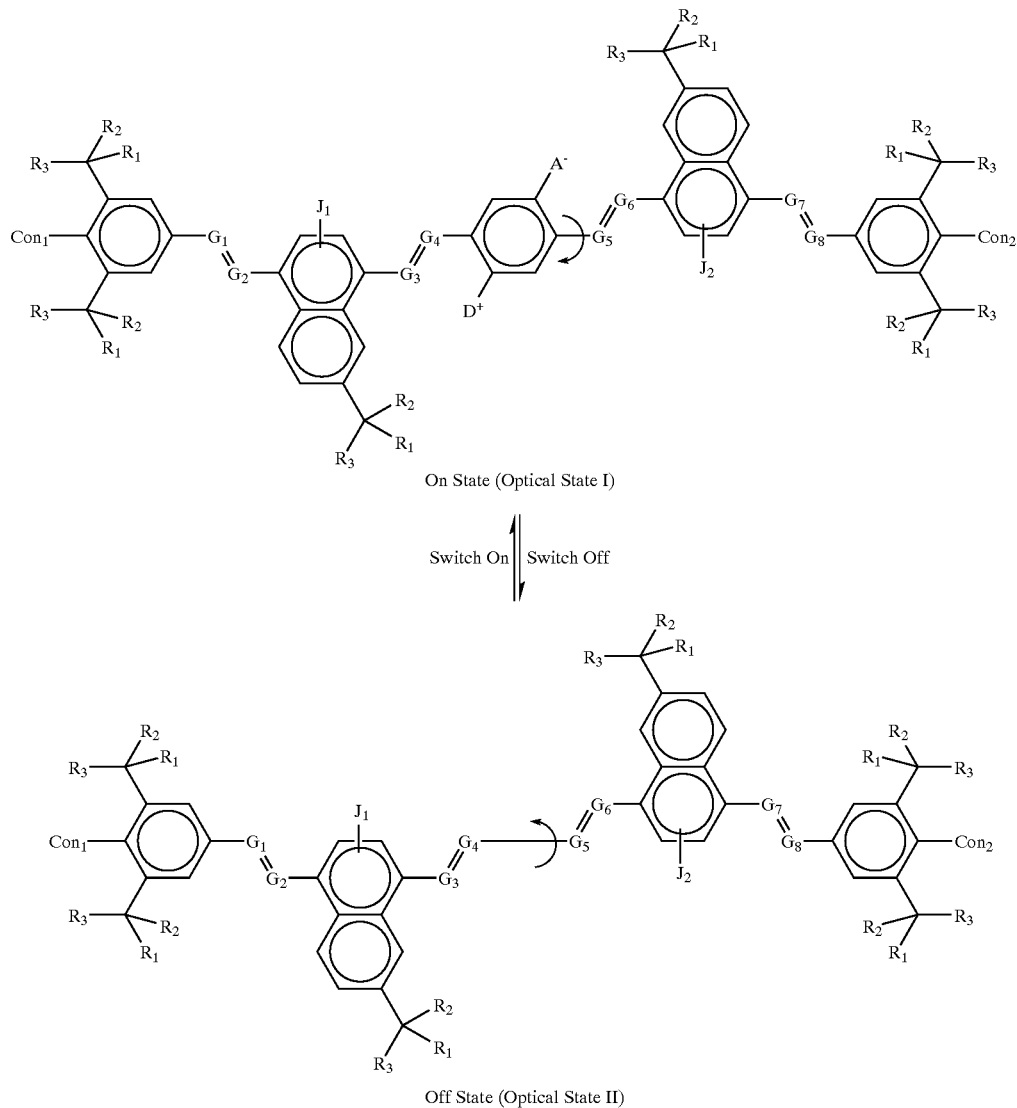

Example 2b

On State (Optical State I)

Switch On | Switch Off

Off State (Optical State II)

where:

The letter $A^-$ is an Acceptor group; it is an electron-withdrawing group. It may be one of following: carboxylic acid or its derivatives, sulfuric acid or its derivatives, phosphoric acid, nitro, nitrile, hetero atoms (e.g., N, O, S, P, F, Cl, Br), or functional group with at least one of above-mentioned hetero atoms (e.g., OH, SH, NH, etc.), hydrocarbons (either saturated or unsaturated) or substituted hydrocarbons.

The letter $D^+$ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

The letters $Con_1$ and $Con_2$ represent optional connecting units between one molecule and another molecule or between a molecule and the solid substrate. They may be any one of the following: hydrogen (utilizing a hydrogen bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

The letters $R_1$, $R_2$ and $R_3$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbon (either saturated or unsaturated) or substituted hydrocarbon.

The letters $G_1$, $G_2$, $G_3$, $G_4$, $G_5$, $G_6$, $G_7$, and $G_8$ are bridging groups. The function of these bridging groups is to connect the stator and rotor or to connect two or more conjugated rings to achieve a desired chromophore. They may be any one of the following: hetero atoms (e.g., C, N, O, S, P, etc.) or functional group with at least one of above-mentioned hetero atoms (e.g., NH or NHNH, etc.), hydrocarbons (either saturated or unsaturated) or substituted hydrocarbons. The connector may alternately comprise a single atom bridge such as an ether bridge with an oxygen atom, or a direct sigma bond between the rotor and stator.

The letters $J_1$ and $J_2$ represent tuning groups built into the molecule. The function of these tuning groups (e.g., OH, NHR, COOH, CN, nitro, etc.) is to provide an appropriate functional effect (e.g. both inductive effect and resonance effects) and/or steric effects. The functional effect is to tune the band gap ($\Delta E_{HOMO/LUMO}$) of the molecule to get the desired electronic as well as optical properties of the molecule. The steric effect is to tune the molecular conformation through steric hindrance, inter- or intra-molecular interaction forces (e.g. hydrogen bonding, Coulomb interaction, van der Waals forces) or to provide bi- or multiple-stability of molecular orientations. They may be any one of the following: hydrogen, hetero atoms (e.g., N, O, S, P, B, F, Cl, Br, and I), functional groups with at least one of above-mentioned hetero atoms, hydrocarbons (either saturated or unsaturated) or substituted hydrocarbons.

The molecule shown above (Example 2b) has been designed with the internal rotor parallel to the orientation axis of the entire molecule. In this case, the external field is applied perpendicular to the molecular axis—the electrodes are oriented parallel to the long axis of the molecule and can be either nominally perpendicular or parallel to the plane of the above model structures. For example, application of an electric field to the upper molecule shown above where the field lines are perpendicular to the molecular axis and pointing upward will cause the rotor as pictured in that diagram to rotate to approximately 90 degrees and appear edge on, as shown in the lower molecular diagram above, and vice versa. In this case, the rotor as pictured in the lower diagram is not coplanar with the rest of the molecule, so this is the blue-shifted optical state of the molecule, or optical state II, whereas the rotor is coplanar with the rest of the molecule on the upper diagram, so this is the red-shifted optical state of the molecule, or optical state I.

For the molecules of Example 2b, the films are grown such that the molecular axis is parallel to the plane of the electrodes. This may involve films that are multiple monolayers thick. The molecules form solid-state or liquid crystals in which the large stator groups are locked into position by intermolecular interactions or direct bonding to a support structure, but the rotor is small enough to move within the lattice of the molecules.

Figure 7A:
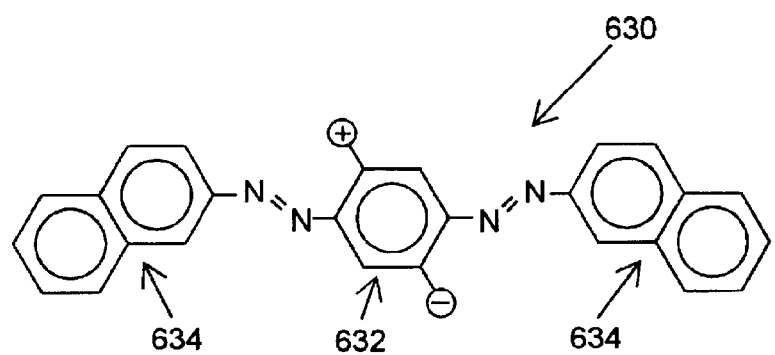
FIG. 7a depicts a molecule comprising a middle rotor portion with a dipole and two end stator portions.

FIG. 7a depicts molecules similar to those of Examples 1b and 2b, but simpler, comprising a middle rotor portion 632 and two end stator portions 634. As in Examples 1b and 2b, the rotor portion 632 comprises a benzene ring that is provided with substituents that render the rotor with a dipole. The two stator portions 634 are each covalently bonded to the benzene ring through an azo linkage, and both portions comprise an aromatic ring.

Figure 7B:
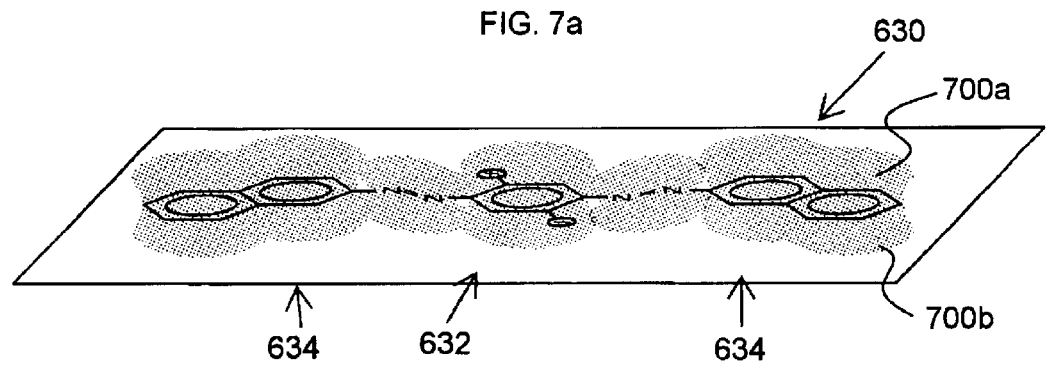
FIG. 7b is a schematic representation (perspective) of the molecule depicted in FIG. 5a, illustrating the planar state, with the rotor and stators all co-planar.
Figure 7C:
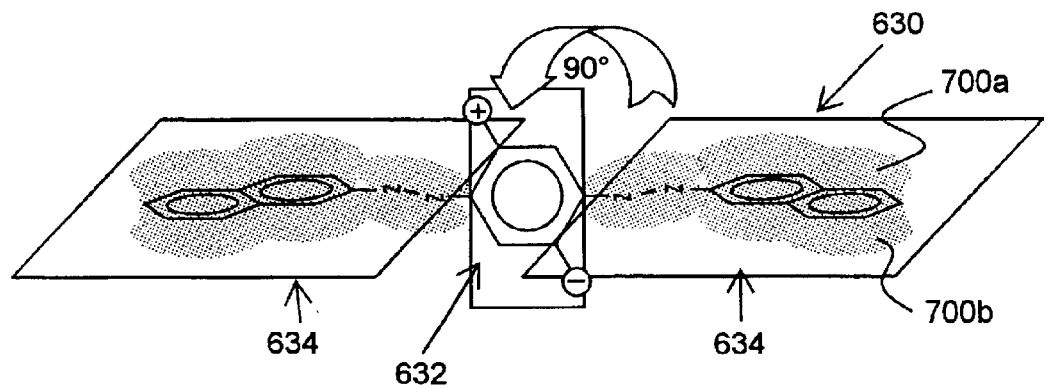
FIG. 7c is also a schematic representation (perspective), illustrating the rotated state, with the rotor rotated 90° with respect to the stators.

FIG. 7b is a schematic representation (perspective), illustrating the planar state, with the rotor 632 and stators 634 all co-planar. In the planar state, the molecule 630 is fully conjugated and evidences color (first spectral or optical state). The conjugation of the rings is illustrated by the 1-orbital clouds 700a, 700b above and below, respectively, the plane of the molecule 630.

FIG. 7c is also a schematic representation (perspective), illustrating the rotated state, with the rotor 632 rotated 90° with respect to the stators 634, which remain co-planar. In the rotated state, the conjugation of the molecule 630 is broken. Consequently, the molecule 630 is in its second spectral (or optical) state.

For color displays, appropriate molecules can be designed that change state from transparent to a particular color or change state from one color to another. For text, it is desired to employ black contrasted with white, as presently done with printed text. White is achieved, as described above, using a white substrate and molecules having a transparent state. To achieve a black color, it is only necessary to recognized that a fully conjugated molecule absorbs across the visible spectrum with an intensity and increasing wavelength that increases with conjugation (more rings). The limit is graphite (carbon black).

The technology disclosed and claimed herein for forming E-field switchable molecules may be used to assemble electronic ink displays and other visual displays.

INDUSTRIAL APPLICABILITY

The field-switchable molecules disclosed herein are expected to find use in electronic ink applications as well as a variety of visual displays.

What is claimed is:

1. A switchable medium for a visual display comprising an electric field activated molecular system configured within an electric field generated by a pair of electrodes, said molecular system having at least one rotor portion connected to at least one stator portion, wherein said at least one rotor portion rotates with respect to said at least one stator portion between at least two different states upon application of said electric field, thereby inducing a band gap change in said molecular system, wherein in a first state, there is extended conjugation throughout said molecular system, resulting in a relatively smaller band gap, and wherein in a second state, said extended conjugation is destroyed changed, resulting in a relatively larger band gap.

2. The switchable medium of claim 1 wherein said molecular system has an orientation axis and wherein said rotor portion is oriented perpendicular to said orientation axis, with said external electric field applied parallel to said orientation axis.

3. The switchable medium of claim 2 wherein said molecular system comprises

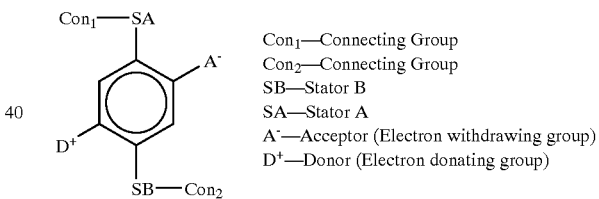

Con$_1$—Connecting Group
Con$_2$—Connecting Group
SB—Stator B
SA—Stator A
A$^-$—Acceptor (Electron withdrawing group)
D$^+$—Donor (Electron donating group)

where:

A$^-$ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, Br, and I), (h) functional groups with at least one of said hetero atoms, (i) saturated or unsaturated hydrocarbons, and (j) substituted hydrocarbons;

D$^+$ is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, an P, wherein said Donor group is more electropositive than said Acceptor group;

Con$_1$ and Con$_2$ are optional connecting units between one molecule and another molecule or between a molecule and a solid substrate, said connecting units selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons; and SA and SB designate Stator A and Stator B, respectively, which may be the same or different and are independently selected from the group consisting of (a) saturated or unsaturated hydrocarbons and (b) substituted least one spacing group is selected from the group consisting of phenyl, isopropyl, and tert-butyl and is used to provide an appropriate 3-dimensional scaffolding to allow molecules to pack together while providing rotational space for each rotor to rotate over a desired range of motion.

4. The switchable medium of claim 3 wherein said molecular system comprises

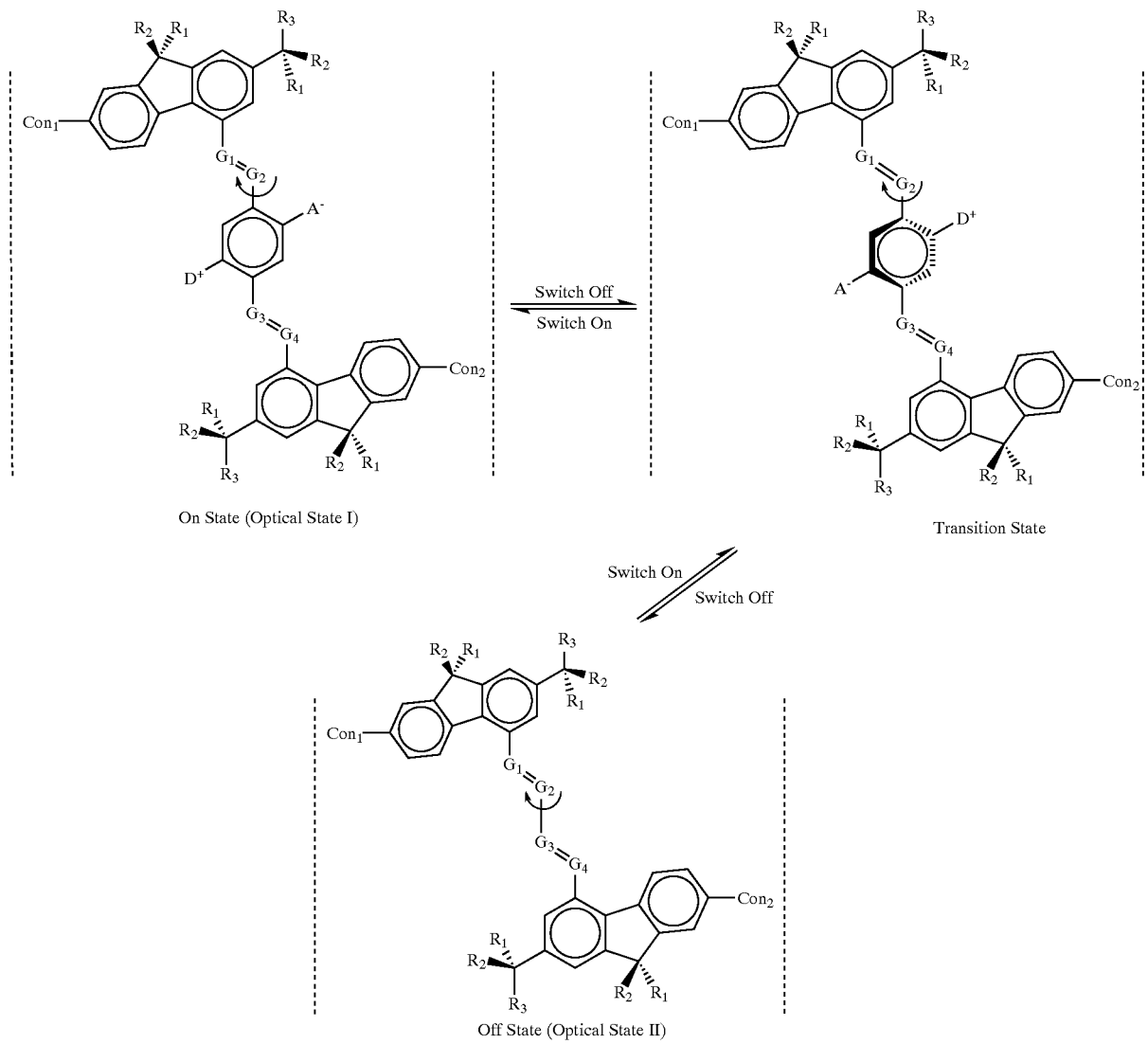

hydrocarbons, wherein said hydrocarbon units contain conjugated rings that contribute to an extended conjugation of the molecule when it is in a planar state (red shifted state), wherein said stators optionally contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect at least two conjugated rings to achieve a desired chromophore or (b) selected from the group consisting of a single atom bridge and a direct sigma bond between said rotor and said stators and wherein said at where:

$A^-$ is said Acceptor group;

$D^+$ is said Donor group;

$Con_1$, and $Con_2$ are said optional connecting units;

$R_1$, $R_2$, $R_3$ are said spacing groups, which are independently selected from the group consisting of: (a) hydrogen, (b) saturated or unsaturated hydrocarbons, and (c) substituted hydrocarbons; and $G_1$, $G_2$, $G_3$, and $G_4$ are said bridging groups, which are independently selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons.

5. The switchable medium of claim 1 wherein said molecular system has an orientation axis and wherein said rotor portion is oriented parallel to said orientation axis, with said external electric field applied perpendicular to said orientation axis.

6. The switchable medium of claim 5 wherein said molecular system comprises:

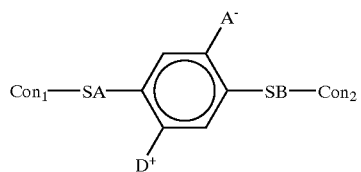

where:
- $A^-$ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;
- $D^+$ is a Donor group comprising an electron-donating group selected from the group consisting of: (a) hydrogen, (b) amines, (c) OH, (d) SH, (e) ethers, (f) saturated or unsaturated hydrocarbon, (g) substituted hydrocarbons, and (h) functional groups with at least one hetero atom selected from the group consisting of B, Si, I, N, O, S, and P, wherein said Donor group is more electropositive than said Acceptor group;
- $Con_1$ and $Con_2$ are optional connecting units between one molecule and another molecule or between a molecule and a solid substrate selected from the group consisting of a metal electrode, an inorganic substrate, and an organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons; and
- SA and SB designate Stator A and Stator B, respectively, which may be the same or different and which are independently selected from the group consisting of (a) unsaturated or saturated hydrocarbons and (b) substituted hydrocarbons, wherein said hydrocarbon units contain conjugated rings that contribute to an extended conjugation of the molecule when it is in a planar state (red shifted state), wherein said stators optionally and separately contain at least one bridging group $G_n$, at least one spacing group $R_n$, or both, wherein said at least one bridging group is either (a) selected from the group consisting of acetylene, ethylene, amide, imide, mine, and azo and is used to connect said stators to said rotor or to connect at least two conjugated rings to achieve a desired chromophore or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecules to pack together while providing rotational space for each rotor to rotate over a desired range of motion.

7. The switchable medium of claim 6 wherein said molecular system comprises:

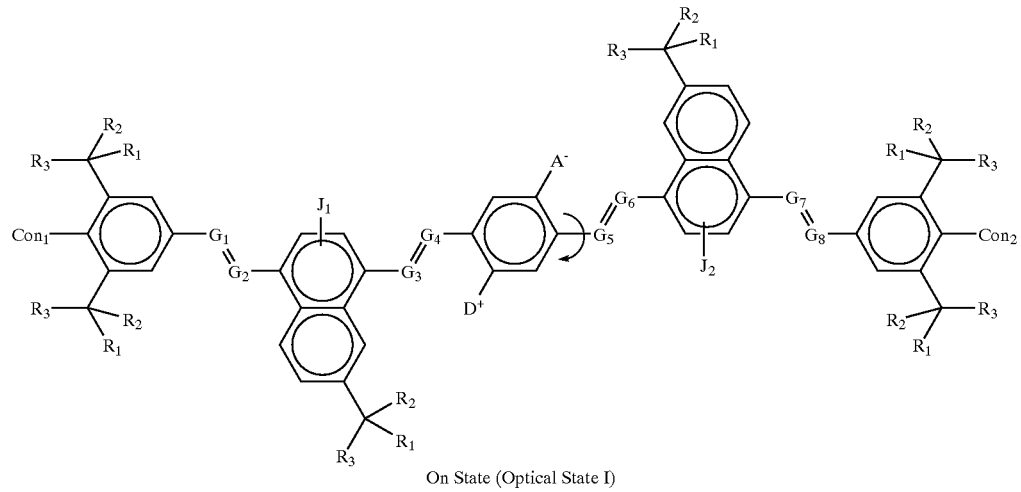

On State (Optical State I)

Switch On | Switch Off

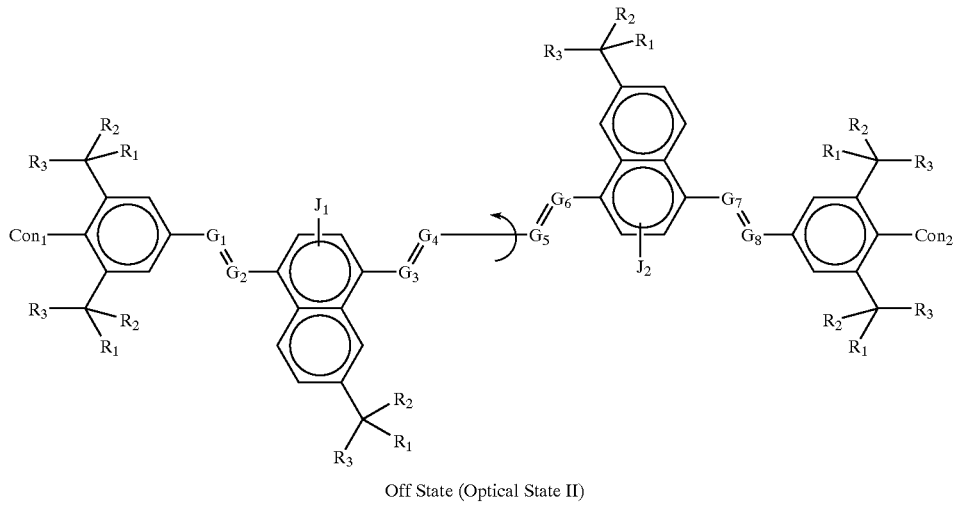

Off State (Optical State II)

where:
- $A^-$ is said Acceptor group;
- $D^+$ is said Donor group;
- $Con_1$ and $Con_2$ are said optional connecting units;
- $R_1$, $R_2$ and $R_3$ are said spacing groups, which are independently selected from the group consisting of: (a) hydrogen, (b) saturated or unsaturated or hydrocarbons, and (c) substituted hydrocarbons;
- $G_1$, $G_2$, $G_3$, $G_4$, $G_5$, $G_6$, $G_7$, and $G_8$ are said bridging groups, which are independently selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons; and
- $J_1$ and $J_2$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons.

8. The switchable medium of claim 1 wherein said molecular system is bi-stable.

9. The switchable medium of claim 1 wherein said molecular system has essentially a low activation barrier between different states to provide a fast, but volatile, switch.

10. The switchable medium of claim 1 wherein said molecular system has more than two switchable states, such that optical properties of said molecular system can be tuned by either continuously by application of a decreasing or increasing electric field to form a volatile switch or the color is changed abruptly by the application of voltage pulses to a switch with at least one activation barrier.

11. The switchable medium of claim 1 wherein said molecular system changes between a transparent state and a colored state.

12. The switchable medium of claim 1 wherein said molecular system changes between one colored state and another colored state.

13. The switchable medium of claim 1 wherein said molecular system comprises one rotor and one stator.

14. The switchable medium of claim 1 wherein said molecular system comprises at least two rotors, each connected to one stator.

15. The switchable medium of claim 1 wherein said molecular system comprises one rotor, connected between two stators.

16. The switchable medium of claim 1 wherein said molecular system comprises alternating rotors and stators.

17. An electronic ink including an electric field activated molecular system configured within an electric field generated by a pair of electrodes, said molecular system having at least one rotor portion connected to at least one stator portion, wherein said at least one rotor portion rotates with respect to said at least one stator portion between at least two different states upon application of said electric field, thereby inducing a color change in said molecular system, wherein in a first state, there is extended conjugation throughout said molecular system, resulting in a first color state, and wherein in a second state, said extended conjugation is changed, resulting in either a transparent slate or a second color state.

18. The electronic ink of claim 17 wherein said molecular system has an orientation axis and wherein said rotor portion is oriented perpendicular to said orientation axis, with said external electric field applied parallel to said orientation axis.

19. The electronic ink of claim 18 wherein stud molecular system comprises

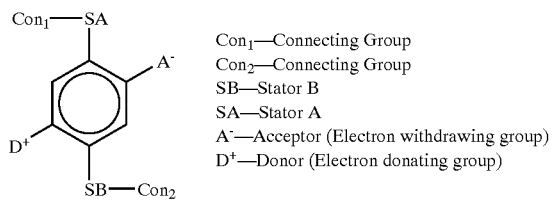

$Con_1$—Connecting Group
$Con_2$—Connecting Group
SB—Stator B
SA—Stator A
$A^-$—Acceptor (Electron withdrawing group)
$D^+$—Donor (Electron donating group)

where:
- $A^-$ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, Br, and I), (h) functional groups with at least one of said hetero atoms, (i) saturated or unsaturated hydrocarbons, and (j) substituted hydrocarbons;

D⁺ is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein said Donor group is more electropositive than said Acceptor group;

$Con_1$ and $Con_2$ are optional connecting units between one molecule and another molecule or between a molecule and a solid substrate, said connecting units selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons; and SA and SB designate Stator A and Stator B, respectively, which may be the same or different and are independently selected from the group consisting of (a) saturated or unsaturated hydrocarbons and (b) substituted hydrocarbons, wherein said hydrocarbon units contain conjugated rings that contribute to an extended conjugation of the molecule when it is in a planar state (red shifted state), wherein said stators optionally contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect at least two conjugated rings to achieve a desired chromophore or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecules to pack together while providing rotational space for each rotor to rotate over a desired range of motion.

20. The electronic ink of claim 19 wherein said molecular system comprises

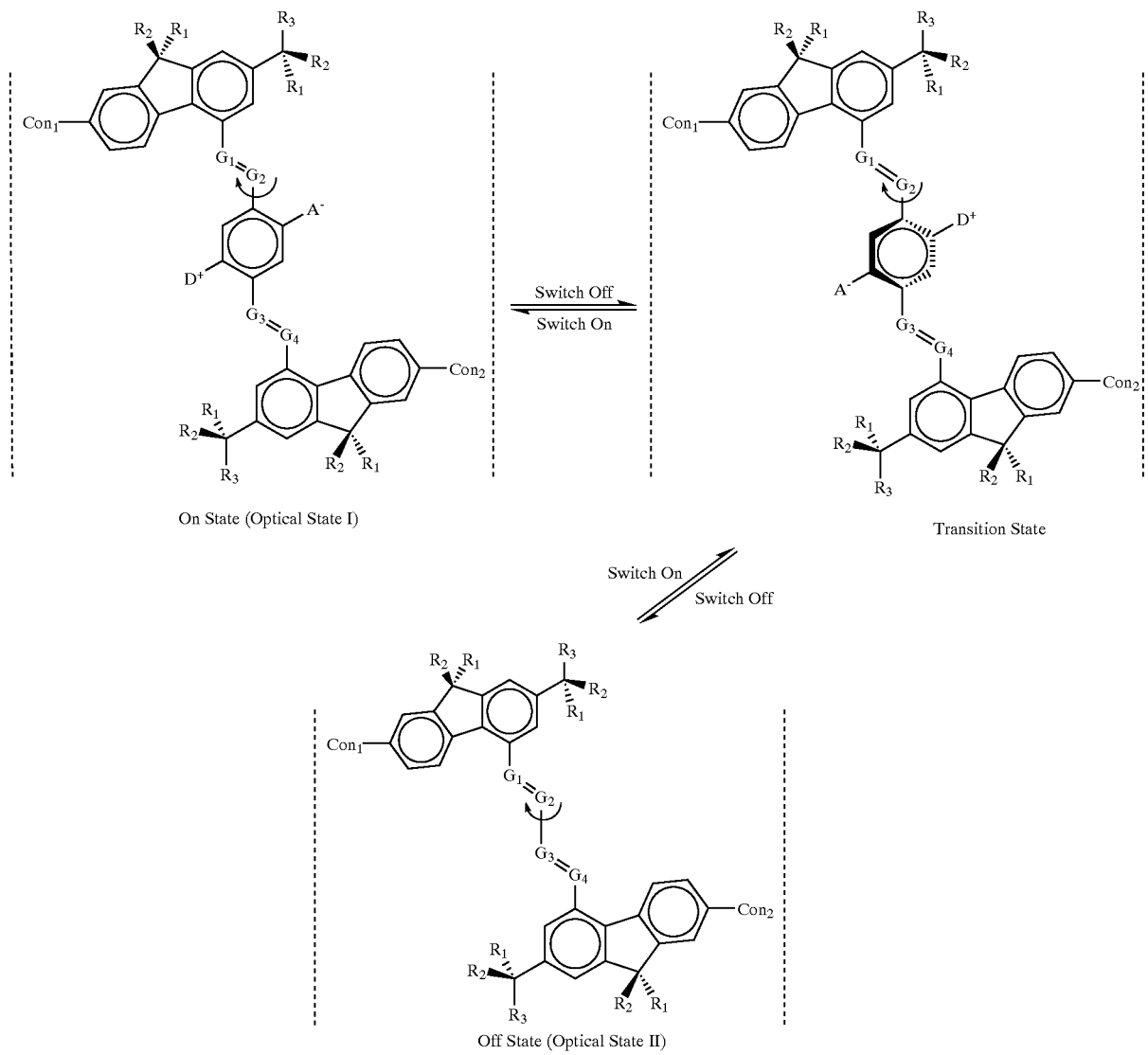

where:
- A⁻ is said Acceptor group;
- D⁺ is said Donor group;
- $Con_1$ and $Con_2$ are said optional connecting units;
- $R_1$, $R_2$, $R_3$ are said spacing groups, which are independently selected from the group consisting of: (a) hydrogen, (b) saturated or unsaturated hydrocarbons, and (c) substituted hydrocarbons; and
- $G_1$, $G_2$, $G_3$, and $G_4$ are said bridging groups, which are independently selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons.

21. The electronic ink of claim 17 wherein said molecular system has an orientation axis and wherein said rotor portion is oriented parallel to said orientation axis, with said external electric field applied perpendicular to said orientation axis.

22. The electronic ink of claim 21 wherein said molecular system comprises:

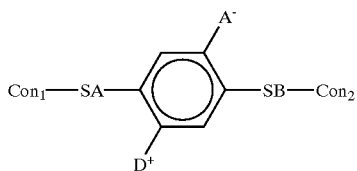

where:
- A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, and Br, (h) functional groups with at least one of said hetero atoms, (i) saturated or unsaturated hyrdrocarbons, and (j) substituted hydrocarbons;
- D⁻ is a Donor group comprising an electron-donating group selected from the group consisting of: (a) hydrogen, (b) amines, (c) OH, (d) SH, (e) ethers, (f) saturated or unsaturated hydrocarbon, (g) substituted hydrocarbons, and (h) functional groups with at least one hetero atom selected from the group consisting of B, Si, I, N, O, S, and P, wherein said Donor group is more electropositive than said Acceptor group;
- $Con_1$ and $Con_2$ are optional connecting units between one molecule and another molecule or between a molecule and a solid substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hyrdrocarbons, and (e) substituted hydrocarbons; and
- SA and SB designate Stator A and Stator B, respectively, which may be the same or different and which are independently selected from the group consisting of (a) unsaturated or saturated hydrocarbons and (b) substituted hydrocarbons, wherein said hydrocarbon units contain conjugated rings that contribute to an extended conjugation of the molecule when it is in a planar state (red shifted state), wherein said stators optionally and separately contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect at least two conjugated rings to achieve a desired chromophore or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecules to pack together while providing rotational space for each rotor to rotate over a desired range of motion.

23. The electronic ink of claim 22 wherein said molecular system comprises:

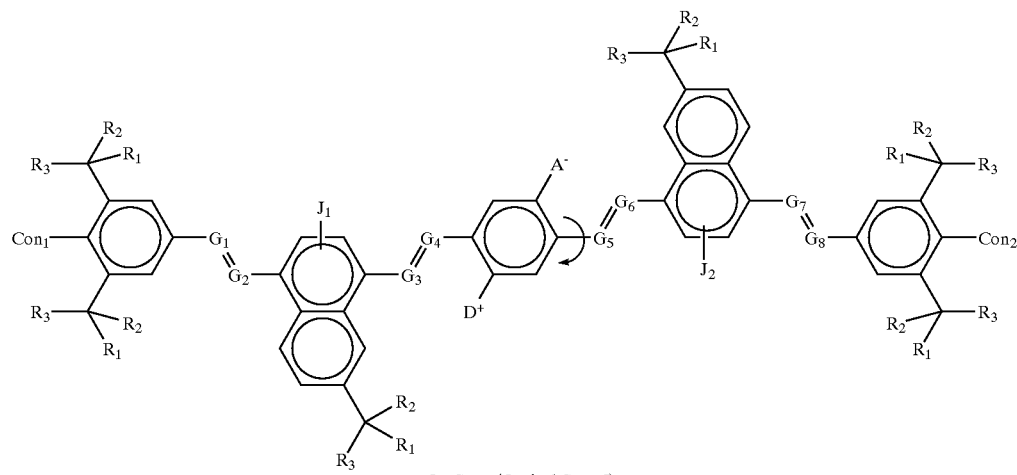

On State (Optical State I)

Switch On | Switch Off

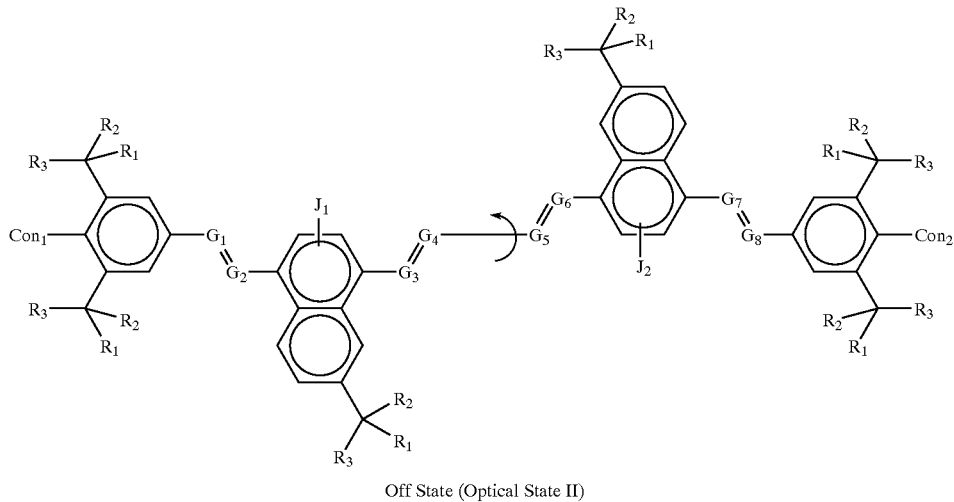

Off State (Optical State II)

where:

A⁻ is said Acceptor group;

D⁺ is said Donor group;

$Con_1$ and $Con_2$ are said optional connecting units;

$R_1$, $R_2$ and $R_3$ are said spacing groups, which are independently selected from the group consisting of: (a) hydrogen, (b) saturated or unsaturated hydrocarbons, and (c) substituted hydrocarbons;

$G_1$, $G_2$, $G_3$, $G_4$, $G_5$, $G_6$, $G_7$, and $G_8$ are said bridging groups, which are independently selected from the group consisting of: (a) hetero atoms selected from the group consisting of N, O, S, and P, (b) functional groups with at least one of said hetero atoms, (c) saturated or unsaturated hydrocarbons, and (d) substituted hydrocarbons; and $J_1$ and $J_2$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons.

24. The electronic ink of claim 17 wherein said molecular system is bi-stable.

25. The electronic ink of claim 17 wherein said molecular system has essentially a low activation barrier between different states to provide a fast, but volatile, switch.

26. The electronic ink of claim 17 wherein said molecular system has more than two switchable states, such that optical properties of said molecular system can be tuned by either continuously by application of a decreasing or increasing electric field to form a volatile switch or the color is changed abruptly by the application of voltage pulses to a switch with at least one activation barrier.

27. The electronic ink of claim 17 wherein said molecular system changes between a transparent state and a colored state.

28. The electronic ink of claim 17 wherein said molecular system changes between one colored state and another colored state.

29. The electronic ink of claim 17 wherein said molecular system comprises one rotor and one stator.

30. The electronic ink of claim 17 wherein said molecular system comprises at least two rotors, each connected to one stator.

31. The electronic ink of claim 17 wherein said molecular system comprises one rotor, connected between two stators.

32. The electronic ink of claim 17 wherein said molecular system comprises alternating rotors and stators.

* * * * *